(12) United States Patent
Yeh et al.

(10) Patent No.: US 8,305,517 B2
(45) Date of Patent: Nov. 6, 2012

(54) LIGHT BAR STRUCTURE, AND BACKLIGHT MODULE AND LIQUID CRYSTAL DISPLAY APPLYING THE SAME

(75) Inventors: Chun-Neng Yeh, Hsinchu County (TW); Ching-Lung Chang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 446 days.

(21) Appl. No.: 12/652,043

(22) Filed: Jan. 5, 2010

(65) Prior Publication Data
US 2011/0051032 A1  Mar. 3, 2011

(30) Foreign Application Priority Data
Aug. 26, 2009  (TW) ................................ 98215794 U

(51) Int. Cl.
*G02F 1/1333* (2006.01)
(52) U.S. Cl. ........................................................ 349/61
(58) Field of Classification Search ...................... 349/61
See application file for complete search history.

(56) References Cited

U.S. PATENT DOCUMENTS

| 7,288,606 | B2 | 10/2007 | Hohn et al. | |
|---|---|---|---|---|
| 2009/0021836 | A1* | 1/2009 | Koch | 359/619 |
| 2009/0273005 | A1* | 11/2009 | Lin | 257/99 |
| 2011/0000645 | A1* | 1/2011 | Chen et al. | 165/104.26 |
| 2012/0200786 | A1* | 8/2012 | Kamata | 348/790 |

FOREIGN PATENT DOCUMENTS
TW  200821694  5/2008
* cited by examiner

*Primary Examiner* — Timothy L Rude
(74) *Attorney, Agent, or Firm* — Jianq Chyun IP Office

(57) ABSTRACT

A light bar structure including a circuit board provided with two hollow frames disposed thereon and a conductive material filled in the two hollow frames; and a light emitting device disposed above the two hollow frames. The conductive material is used for electrically connect the circuit board with the light emitting device so as to prevent misalignment of the light emitting device. A backlight module and a liquid crystal display both applying the light bar structure is also provided.

33 Claims, 5 Drawing Sheets

# LIGHT BAR STRUCTURE, AND BACKLIGHT MODULE AND LIQUID CRYSTAL DISPLAY APPLYING THE SAME

CROSS-REFERENCE TO RELATED APPLICATION

This application claims the priority benefit of Taiwan application serial no. 98215794, filed on Aug. 26, 2009. The entirety of the above-mentioned patent application is hereby incorporated by reference herein and made a part of specification.

BACKGROUND OF THE INVENTION

1. Field of the Invention

The present invention relates to a light bar structure, and more particularly to the light bar structure for locating a light emitting device.

2. Description of Related Art

Traditionally, a light emitting diode (LED) is attached to a light bar by surface mount technology (SMT), by which printed circuit boards (PCBs) are sequentially transported to the production line, and then steps including solder paste printing, LED mounting and heating are performed to accomplish a soldering process. Although the LEDs have been located at the start of the soldering process, deviation of LEDs may still occurs due to the melt of the solder paste in the soldering process, which results in misalignment of LEDs on the light bar and leads to inferior light output performance.

To solve the above problems, parameters in the soldering process, such as composition of solder paste, heating temperature, heating duration, heating rate, etc., are regulated to find out an optimal condition of process for reducing the deviation of LEDs on the light bar.

Although the above method improves the alignment of LEDs on the light bar to a certain degree, people still suffer from bulky considerations in evaluating the process parameters. A wrong evaluation may lead to mismatch between supply and demand, low production yield, prolongation of production duration, extra burden of manpower, and inferior quality of products. Thus, evaluation of the process parameters is an important issue in SMT production.

SUMMARY OF THE INVENTION

The present invention is capable of preventing deviation of a light emitting device of a light bar due to heating in soldering process.

The present invention can further reduce the duration of process evaluation, increase production efficiency, and improve quality and yield of manufacture.

As embodied and broadly described herein, the present invention provides a light bar structure including a circuit board provided with two hollow frames disposed thereon and a conductive material filled in the two hollow frames; and a light emitting device disposed above the two hollow frames.

The present invention also provides a backlight module comprising: at least a reflective sheet; at least a light guiding plate disposed over the reflective sheet; at least an optical film disposed over the light guiding plate; and at least a light emitting unit disposed at a side of the light guiding plate, the light emitting unit having a light bar structure comprising: a circuit board; two hollow frames disposed on the circuit board, wherein each of the hollow frames is filled with a conductive material electrically connected to the circuit board; and a light emitting device disposed on the two hollow frames and electrically connected to the conductive material; and at least a bezel for accommodating and locating the reflective sheet, the light guiding plate, the optical film and the light emitting unit.

The present invention further provides a liquid crystal display comprising: a backlight module comprising: at least a reflective sheet; at least a light guiding plate disposed over the reflective sheet; at least an optical film disposed over the light guiding plate; and at least a light emitting unit disposed at a side of the light guiding plate, the light emitting unit having a light bar structure comprising: a circuit board; two hollow frames disposed on the circuit board, wherein each of the hollow frames is filled with a conductive material electrically connected to the circuit board; and a light emitting device disposed on the two hollow frames and electrically connected to the conductive material; and at least a bezel for accommodating and locating the reflective sheet, the light guiding plate, the optical film and the light emitting unit; and a panel disposed on the backlight module.

According to an embodiment of the invention, the two hollow frames may comprise a soldering resist material.

According to an embodiment of the present invention, the soldering resist material may comprise a thermosetting resin.

According to an embodiment of the invention, the thermosetting resin may comprise an epoxy resin (EP) or a silicone resin (SP).

According to an embodiment of the invention, a height of the conductive material is larger than a height of the two hollow frames.

According to an embodiment of the present invention, the conductive material may comprise a solder paste.

According to an embodiment of the invention, the light emitting device has two conductive terminals, and each of the conductive terminals is electrically connected to the conductive material in the corresponding hollow frame.

According to an embodiment of the invention, the light emitting device is bonded to the circuit board by soldering the conductive material.

According to an embodiment of the present invention, the above light bar structure, backlight module and liquid crystal display may further comprise a plurality of light emitting devices spaced with one another in equidistance.

According to an embodiment of the invention, the light emitting device may comprise a light emitting diode.

According to an embodiment of the present invention, the above light bar structure, the backlight module and the liquid crystal display may further comprise a thermosetting paste disposed between the circuit board and the light emitting device for attaching the light emitting device to the circuit board.

To make the above and other features and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
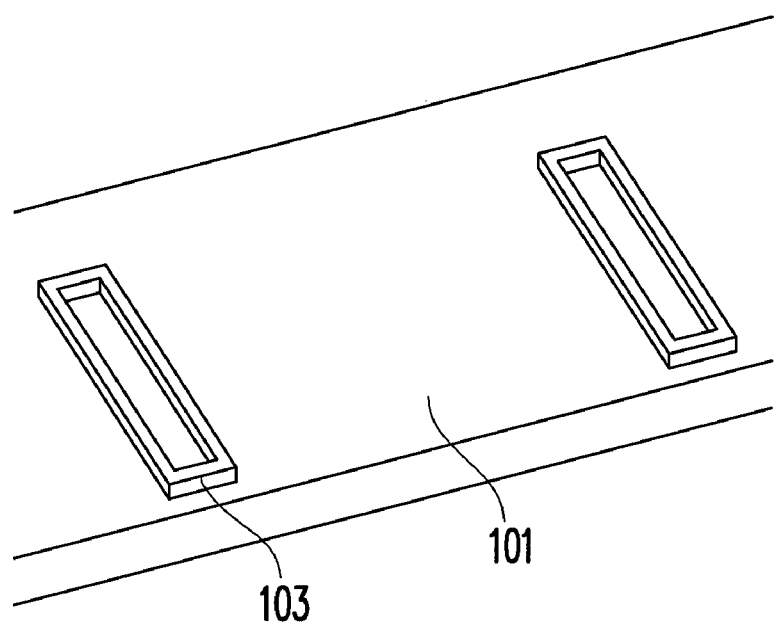
FIGS. 1A through 1E are schematic views of a light bar structure according to a first embodiment of the present invention.

Descriptions of the present invention are given below with reference to the embodiments illustrated in accompanying drawings, wherein same or similar elements or steps are denoted with same reference numerals.

FIGS. 1A through 1E are schematic views of a light bar structure according to a first embodiment of the present invention. The present embodiment provides a light bar structure 10 including a circuit board 101 provided with two hollow frames 103 disposed thereon and a conductive material 105 filled in the two hollow frames 103; and a light emitting device 107 disposed above the two hollow frames 103. The circuit board 101 is electrically connected to the light emitting device 107 via the conductive material 105.

In the illustrated first embodiment, the conductive material 105 may be a solder paste.

In the illustrated first embodiment, the light emitting device 107 may be a light emitting diode.

In the illustrated first embodiment, a material of the above hollow frames 103 can be selected from a high temperature resistant soldering material, such as a polymer or mixture of epoxy resin (EP) or silicone resin (SP). By which, the melted conductive material 105 can be kept on substantially the same location of the circuit board 101 without spreading out as being heated in the soldering process of the light bar structure 10, such that the orientation and alignment of the attachment of the light emitting device 107 can be improved.

Figure 1B:
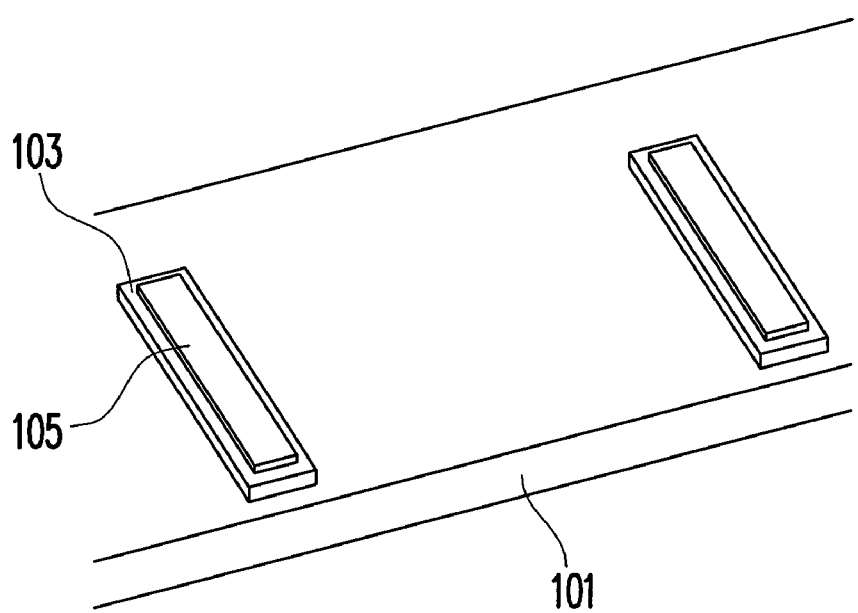
Figure 1C:
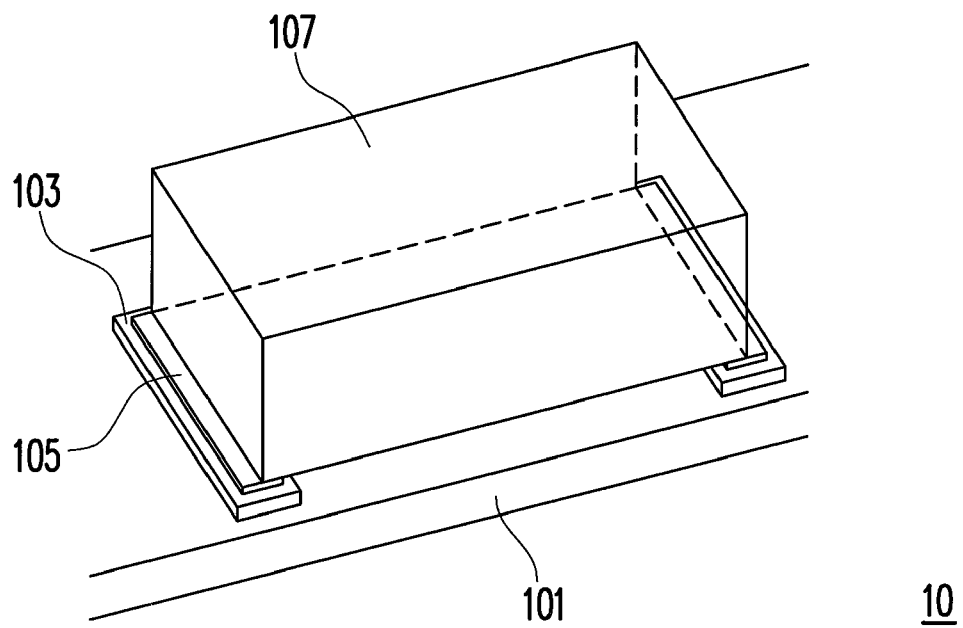
Figure 1D:
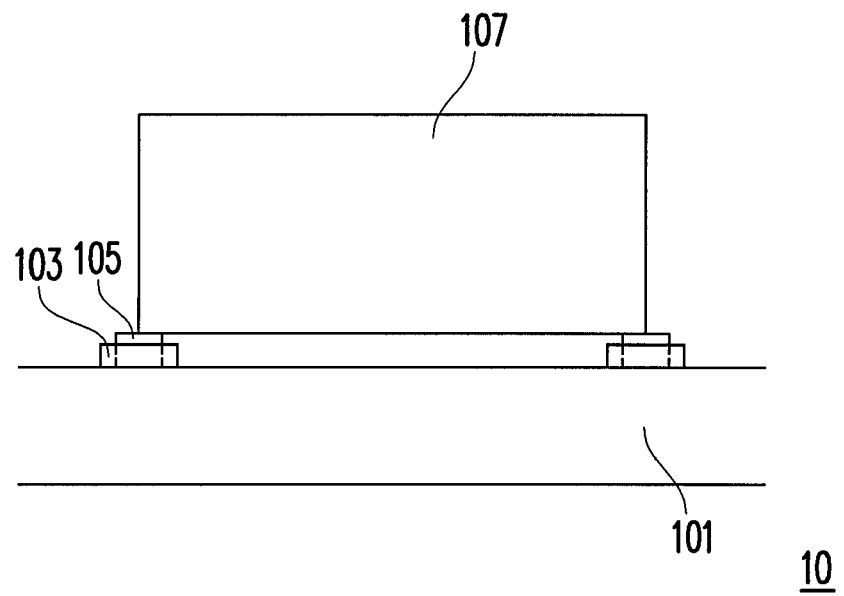
Figure 1E:
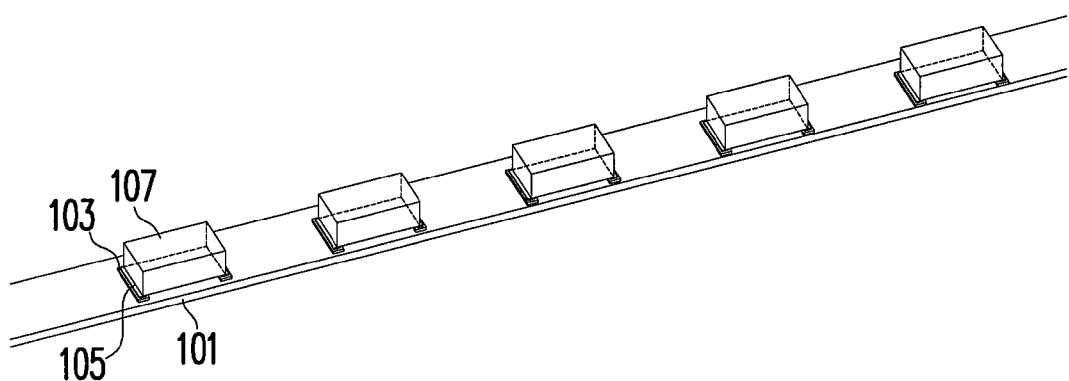

FIG. 1A shows disposing the hollow frames 103 on the circuit board 101. FIG. 1B shows filling the conductive material 105 into the hollow frames 103. FIGS. 1C and 1D show attaching the light emitting device 107 on the circuit board 101. Comparing with the conventional light bar structure, the light bar structure 10 of the embodiment further includes the hollow frames 103 and the conductive material 105 which is in a height larger than that of the hollow frames 103 and further kept from overflowing outside the hollow frames 103, such that the two conductive terminals (not shown) of the light emitting device 107 can be electrically connected to the conductive material 105 in the hollow frames 103. FIG. 1E shows plural light emitting devices 107 being bonded to the circuit board 101 by soldering the conductive material 105, wherein the light emitting devices 107 are spaced with one another in equidistance.

Figure 2A:
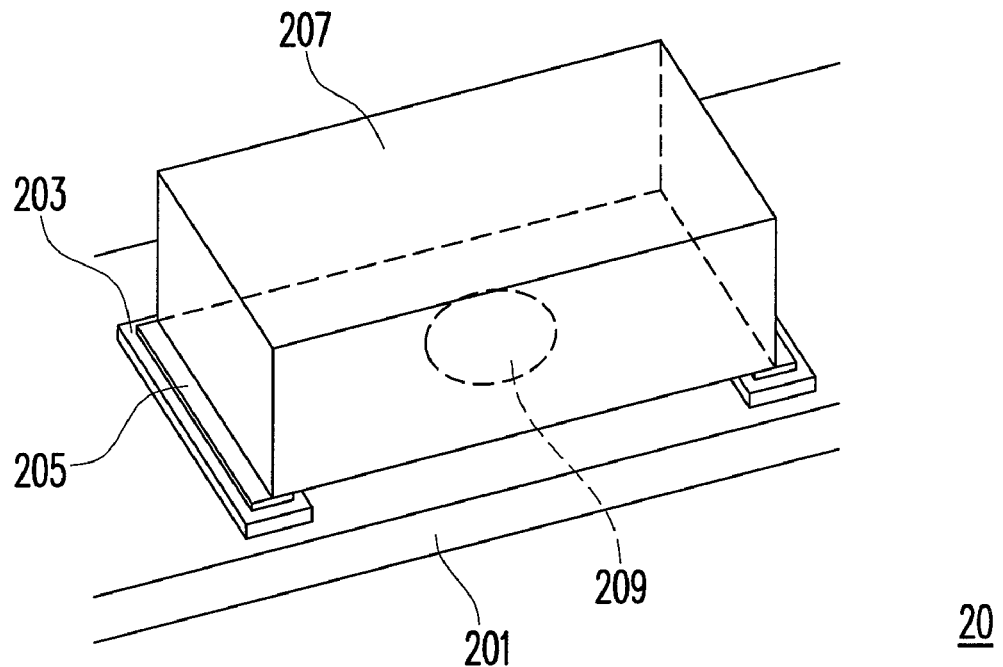
FIGS. 2A and 2B are schematic views of another light bar structure according to a second embodiment of the present invention.
Figure 2B:
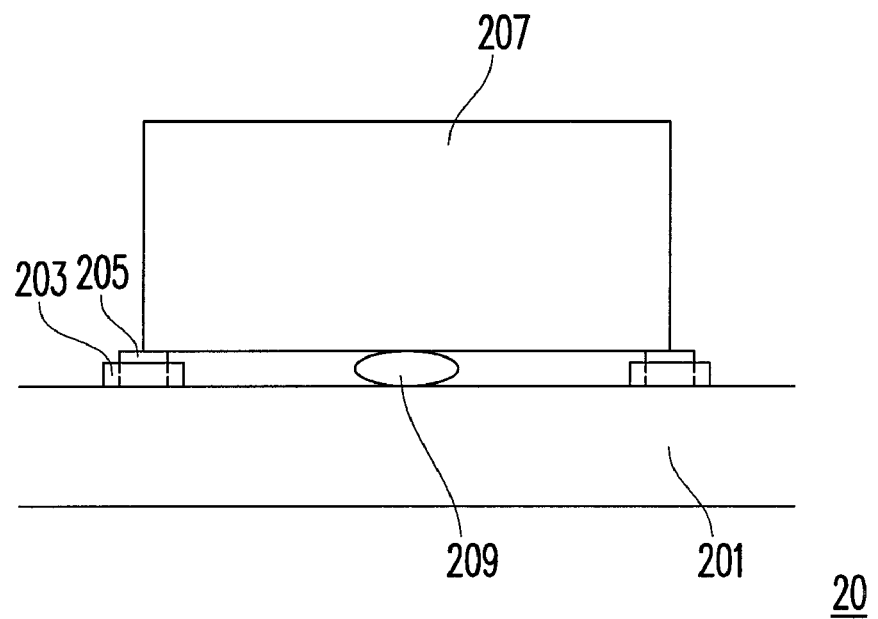

FIGS. 2A and 2B are schematic views of another light bar structure according to a second embodiment of the present invention. The spirit of the present embodiment is similar to that described in the first embodiment, wherein the main difference between the present embodiment and the first embodiment is that at least a thermosetting paste is disposed between the circuit board and the light emitting device. The present embodiment provides a light bar structure 20 including a circuit board 201 provided with two hollow frames 203 disposed thereon and a conductive material 205 filled in the two hollow frames 203; and a light emitting device 207 disposed above the two hollow frames 203. The circuit board 201 is electrically connected to the light emitting device 207 via the conductive material 205. At least a thermosetting paste 209 is disposed between the circuit board 201 and the light emitting device 209 for attaching the light emitting device 207 to the circuit board 201.

In the illustrated second embodiment, the conductive material 205 may be a solder paste.

In the illustrated second embodiment, the light emitting device 207 may be a light emitting diode.

In the illustrated first embodiment, a material of the above hollow frames 203 can be selected from a high temperature resistant soldering material, such as a polymer or mixture of epoxy resin (EP) or silicone resin (SP). By which, the melted conductive material 205 can be kept on substantially the same location of the circuit board 201 without spreading out as being heated in the soldering process of the light bar structure 20, such that the orientation and alignment of the attachment of the light emitting device 207 can be improved.

In the illustrated second embodiment, the thermosetting paste is applied on at least one of the light emitting device 207 and the circuit board 201 before the light emitting device 207 is attached to the circuit board 201, so as to further fixing the relative position of the circuit board 201 and the light emitting device 207 and prevent deviations in the soldering process.

Figure 3:
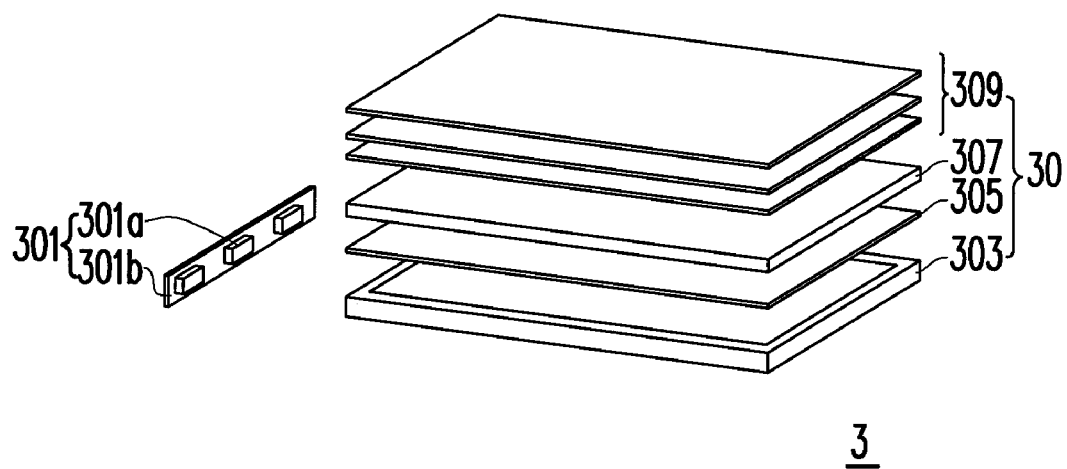
FIG. 3 is a schematic view of a backlight module according to a third embodiment of the present invention.

FIG. 3 is a schematic view of a backlight module according to a third embodiment of the present invention. The third embodiment provides a backlight module 30 comprising: at least a reflective sheet 305; at least a light guiding plate 307 disposed over the reflective sheet 305; at least an optical film 309 disposed over the light guiding plate 307; and at least a light emitting unit 301 disposed at a side of the light guiding plate 307, the light emitting unit 301 having a light bar structure comprising: at least a light emitting device 301a and a circuit board 301b; and at least a bezel 303 for accommodating and locating the reflective sheet 305, the light guiding plate 307, the optical film 309 and the light emitting unit 301.

In the illustrated third embodiment, the light bar structure can be referred to the light bar structure 10 of the first embodiment or the light bar structure 20 of the second embodiment, such that the details are not repeated herein.

Figure 4:
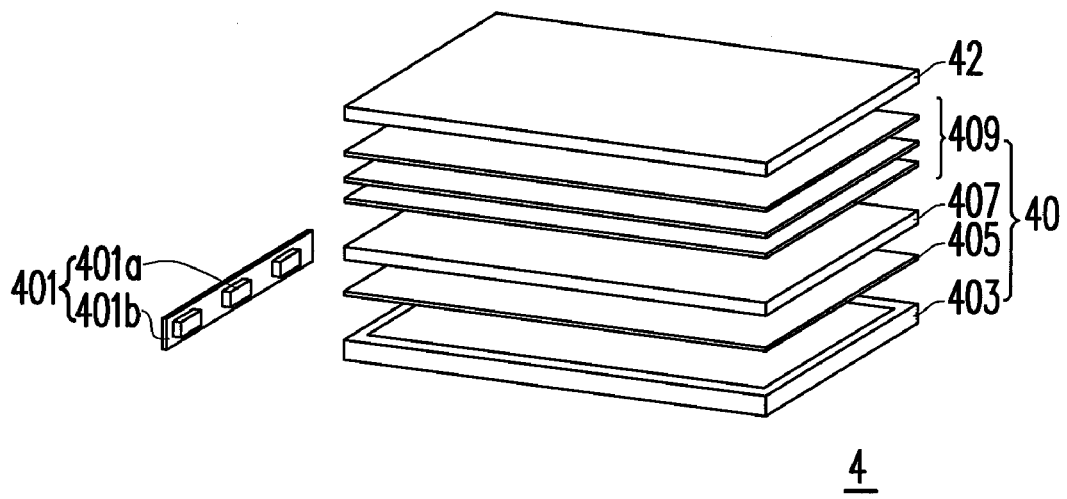
FIG. 4 is a schematic view of a liquid crystal display according to a fourth embodiment of the present invention.

FIG. 4 is a schematic view of a liquid crystal display according to a fourth embodiment of the present invention. The fourth embodiment provides a liquid crystal display 4 comprising a backlight module 40 and a panel 42 disposed on the backlight module 40, wherein the backlight module 40 comprises: at least a reflective sheet 405; at least a light guiding plate 407 disposed over the reflective sheet 405; at least an optical film 409 disposed over the light guiding plate 407; and at least a light emitting unit 401 disposed at a side of the light guiding plate 407, the light emitting unit 401 having a light bar structure comprising: at least a light emitting device 401a and a circuit board 401b; and at least a bezel 403 for accommodating and locating the reflective sheet 405, the light guiding plate 407, the optical film 409 and the light emitting unit 401.

In the illustrated third embodiment, the backlight module can be referred to the backlight module 30 of the third embodiment, and the light bar structure can be referred to the light bar structure 10 of the first embodiment or the light bar structure 20 of the second embodiment, such that the details are not repeated herein.

In summary, the present invention provides a light bar structure and a backlight module and the liquid crystal display both applying the light bar structure, wherein hollow frames of the light bar structure are used to locating the conductive material and thereby the alignment of the attachment of the light emitting device can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light bar structure, comprising:
   a circuit board;
   two hollow frames disposed on the circuit board, wherein each of the hollow frames is filled with a conductive material electrically connected to the circuit board; and
   a light emitting device disposed on the two hollow frames and electrically connected to the conductive material.

2. The light bar structure as claimed in claim 1, wherein the two hollow frames comprise a soldering resist material.

3. The light bar structure as claimed in claim 2, wherein the soldering resist material comprises a thermosetting resin.

4. The light bar structure as claimed in claim 3, wherein the thermosetting resin comprises an epoxy resin (EP) or a silicone resin (SP).

5. The light bar structure as claimed in claim 1, wherein a height of the conductive material is larger than a height of two hollow frames.

6. The light bar structure as claimed in claim 1, wherein the conductive material comprises a solder paste.

7. The light bar structure as claimed in claim 1, wherein the light emitting device has two conductive terminals, and each of the conductive terminals is electrically connected to the conductive material in the corresponding hollow frame.

8. The light bar structure as claimed in claim 1, wherein the light emitting device is bonded to the circuit board by soldering the conductive material.

9. The light bar structure as claimed in claim 1, further comprising a plurality of light emitting devices spaced with one another in equidistance.

10. The light bar structure as claimed in claim 1, wherein the light emitting device comprises a light emitting diode.

11. The light bar structure as claimed in claim 1, further comprising a thermosetting paste disposed between the circuit board and the light emitting device for attaching the light emitting device to the circuit board.

12. A backlight module, comprising:
    at least a reflective sheet;
    at least a light guiding plate disposed over the reflective sheet;
    at least an optical film disposed over the light guiding plate; and
    at least a light emitting unit disposed at a side of the light guiding plate, the light emitting unit having a light bar structure comprising:
       a circuit board;
       two hollow frames disposed on the circuit board, wherein each of the hollow frames is filled with a conductive material electrically connected to the circuit board; and
       a light emitting device disposed on the two hollow frames and electrically connected to the conductive material; and
    at least a bezel for accommodating and locating the reflective sheet, the light guiding plate, the optical film and the light emitting unit.

13. The backlight module as claimed in claim 12, wherein the two hollow frames comprise a soldering resist material.

14. The backlight module as claimed in claim 13, wherein the soldering resist material comprises a thermosetting resin.

15. The backlight module as claimed in claim 14, wherein the thermosetting resin comprises an epoxy resin (EP) or a silicone resin (SP).

16. The backlight module as claimed in claim 12, wherein a height of the conductive material is larger than a height of two hollow frames.

17. The backlight module as claimed in claim 12, wherein the conductive material comprises a solder paste.

18. The backlight module as claimed in claim 12, wherein the light emitting device has two conductive terminals, and each of the conductive terminals is electrically connected to the conductive material in the corresponding hollow frame.

19. The backlight module as claimed in claim 12, wherein the light emitting device is bonded to the circuit board by soldering the conductive material.

20. The backlight module as claimed in claim 12, further comprising a plurality of light emitting devices spaced with one another in equidistance.

21. The backlight module as claimed in claim 12, wherein the light emitting device comprises a light emitting diode.

22. The backlight module as claimed in claim 12, further comprising a thermosetting paste disposed between the circuit board and the light emitting device for attaching the light emitting device to the circuit board.

23. A liquid crystal display, comprising:
    a backlight module, comprising:
       at least a reflective sheet;
       at least a light guiding plate disposed over the reflective sheet;
       at least an optical film disposed over the light guiding plate; and
       at least a light emitting unit disposed at a side of the light guiding plate, the light emitting unit having a light bar structure comprising:
          a circuit board;
          two hollow frames disposed on the circuit board, wherein each of the hollow frames is filled with a conductive material electrically connected to the circuit board; and
          a light emitting device disposed on the two hollow frames and electrically connected to the conductive material; and
       at least a bezel for accommodating and locating the reflective sheet, the light guiding plate, the optical film and the light emitting unit; and
    a panel, disposed on the backlight module.

24. The liquid crystal display as claimed in claim 23, wherein the two hollow frames comprise a soldering resist material.

25. The liquid crystal display as claimed in claim 24, wherein the soldering resist material comprises a thermosetting resin.

26. The liquid crystal display as claimed in claim 25, wherein the thermosetting resin comprises an epoxy resin (EP) or a silicone resin (SP).

27. The liquid crystal display as claimed in claim 23, wherein a height of the conductive material is larger than a height of two hollow frames.

28. The liquid crystal display as claimed in claim 23, wherein the conductive material comprises a solder paste.

29. The liquid crystal display as claimed in claim 23, wherein the light emitting device has two conductive terminals, and each of the conductive terminals is electrically connected to the conductive material in the corresponding hollow frame.

30. The liquid crystal display as claimed in claim 23, wherein the light emitting device is bonded to the circuit board by soldering the conductive material.

31. The liquid crystal display as claimed in claim 23, further comprising a plurality of light emitting devices spaced with one another in equidistance.

32. The liquid crystal display as claimed in claim 23, wherein the light emitting device comprises a light emitting diode.

33. The liquid crystal display as claimed in claim 23, further comprising a thermosetting paste disposed between the circuit board and the light emitting device for attaching the light emitting device to the circuit board.

* * * * *